United States Patent
Oki (10) Patent No.: US 10,411,721 B2
(45) Date of Patent: Sep. 10, 2019

(54) SEMICONDUCTOR DEVICE AND CONTROL SYSTEM

(71) Applicant: RENESAS ELECTRONICS CORPORATION, Tokyo (JP)

(72) Inventor: Masashi Oki, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 15/816,655

(22) Filed: Nov. 17, 2017

(65) Prior Publication Data

US 2018/0175866 A1 Jun. 21, 2018

(30) Foreign Application Priority Data

Dec. 21, 2016 (JP) ................. 2016-248382

(51) Int. Cl.
| | |
|---|---|
| H03L 7/14 | (2006.01) |
| H03L 7/093 | (2006.01) |
| G05F 1/59 | (2006.01) |
| G05F 1/56 | (2006.01) |
| H03L 7/18 | (2006.01) |
| H03L 1/00 | (2006.01) |
| H03L 7/099 | (2006.01) |

(52) U.S. Cl.
CPC ............... *H03L 7/14* (2013.01); *G05F 1/561* (2013.01); *G05F 1/59* (2013.01); *H03L 1/00* (2013.01); *H03L 7/093* (2013.01); *H03L 7/099* (2013.01); *H03L 7/18* (2013.01)

(58) Field of Classification Search
CPC ... H03L 7/14; H03L 1/00; H03L 7/093; H03L 7/099; H03L 7/18; G05F 1/561; G05F 1/59
See application file for complete search history.

(56) References Cited

U.S. PATENT DOCUMENTS

| | | | | |
|---|---|---|---|---|
| 4,065,725 A | * | 12/1977 | Lillis | H03G 1/0005 330/254 |
| 7,190,201 B2 | * | 3/2007 | Haerle | H03L 7/0812 327/158 |
| 8,264,286 B2 | | 9/2012 | Hirai | |
| 2008/0069285 A1 | * | 3/2008 | Kon | H03L 7/143 375/376 |
| 2008/0164950 A1 | * | 7/2008 | Kelkar | H03L 7/0995 331/16 |

FOREIGN PATENT DOCUMENTS

JP 2010-062707 A 3/2010

* cited by examiner

*Primary Examiner* — Daniel C Puentes
(74) *Attorney, Agent, or Firm* — McDermott Will & Emery LLP (57) ABSTRACT

An abnormal rise of oscillation frequencies of PLL circuits in conventional semiconductor devices has been an inevitable problem. This semiconductor device includes a phase difference detection circuit, a loop filter, and a voltage controlled oscillator that outputs an output clock signal. The voltage controlled oscillator includes a voltage-current converter that generates a control current having a current value in accordance with the voltage level of a frequency control voltage, an oscillator that varies the frequency of the output clock signal in accordance with the current value of the control current, and a current limiter that limits the current flowing in the oscillator in accordance with a limiting voltage transmitted through a signal-flow path provided independently from the other circuits.

7 Claims, 8 Drawing Sheets

SEMICONDUCTOR DEVICE AND CONTROL SYSTEM

CROSS-REFERENCE TO RELATED APPLICATIONS

The disclosure of Japanese Patent Application No. 2016-248382 filed on Dec. 21, 2016 including the specification, drawings and abstract is incorporated herein by reference in its entirety.

BACKGROUND

The present invention relates to semiconductor devices and control systems, and, for example, to a semiconductor device including a phase locked loop (PLL) circuit that generates a clock signal having a predetermined frequency, and a control system including the semiconductor device.

Some semiconductor devices use a PLL circuit to generate operating clocks having a required frequency from reference clocks having a constant frequency. An example of the PLL circuit is disclosed in Japanese Unexamined Patent Application Publication No. 2010-62707 (Patent literature 1).

The PLL circuit disclosed in Japanese Unexamined Patent Application Publication No. 2010-62707 includes: a voltage-current converter that converts a voltage into a control current, the voltage being generated in accordance with a phase difference between an input pulse signal and a feedback pulse signal fed back from an output side; a current controlled oscillator that generates a pulse signal having a frequency in accordance with the control current; a current detection unit that detects the control current; and a frequency range switch that switches a frequency range of the output pulse signal, which is output from the current controlled oscillator, in accordance with the detected control current.

SUMMARY

The PLL circuit described above generates a clock signal having a predetermined frequency by using the oscillator; however, in the event of fault in the PLL circuit, the current that affects the frequency of the clock signal output from the oscillator may sometimes abnormally increase. The current increase due to the fault may cause the PLL circuit to output a clock signal whose frequency exceeds the maximum frequency acceptable to a circuit to which the clock signal is supplied, which may cause system malfunctions. A problem arising in the PLL circuit in Japanese Unexamined Patent Application Publication No. 2010-62707 is that there is no measure to prevent the abnormal rise of the frequency of the output clock signal.

Other problems and novel features of the present invention will become apparent from the following description in the specification and the accompanying drawings.

A semiconductor device according to an embodiment includes a phase difference detection circuit, a loop filter, and a voltage controlled oscillator that outputs an output clock signal. The voltage controlled oscillator includes a voltage-current converter that generates a control current having a current value in accordance with a voltage level of a frequency control voltage, an oscillator that varies the frequency of the output clock signal in accordance with the current value of the control current, and a current limiting circuit that limits the current flowing in the oscillator in accordance with a limiting voltage transmitted through a signal-flow path provided independently from the other circuits.

According to the embodiment, the semiconductor device has a PLL circuit that can limit the maximum frequency of the output clock signal.

DETAILED DESCRIPTION

First Embodiment

The following descriptions and the drawings are appropriately omitted and simplified for clarifying the explanations. Through all the drawings, like components are denoted by like numerals, and the explanations thereof will not be repeated on an as needed basis.

Figure 1:
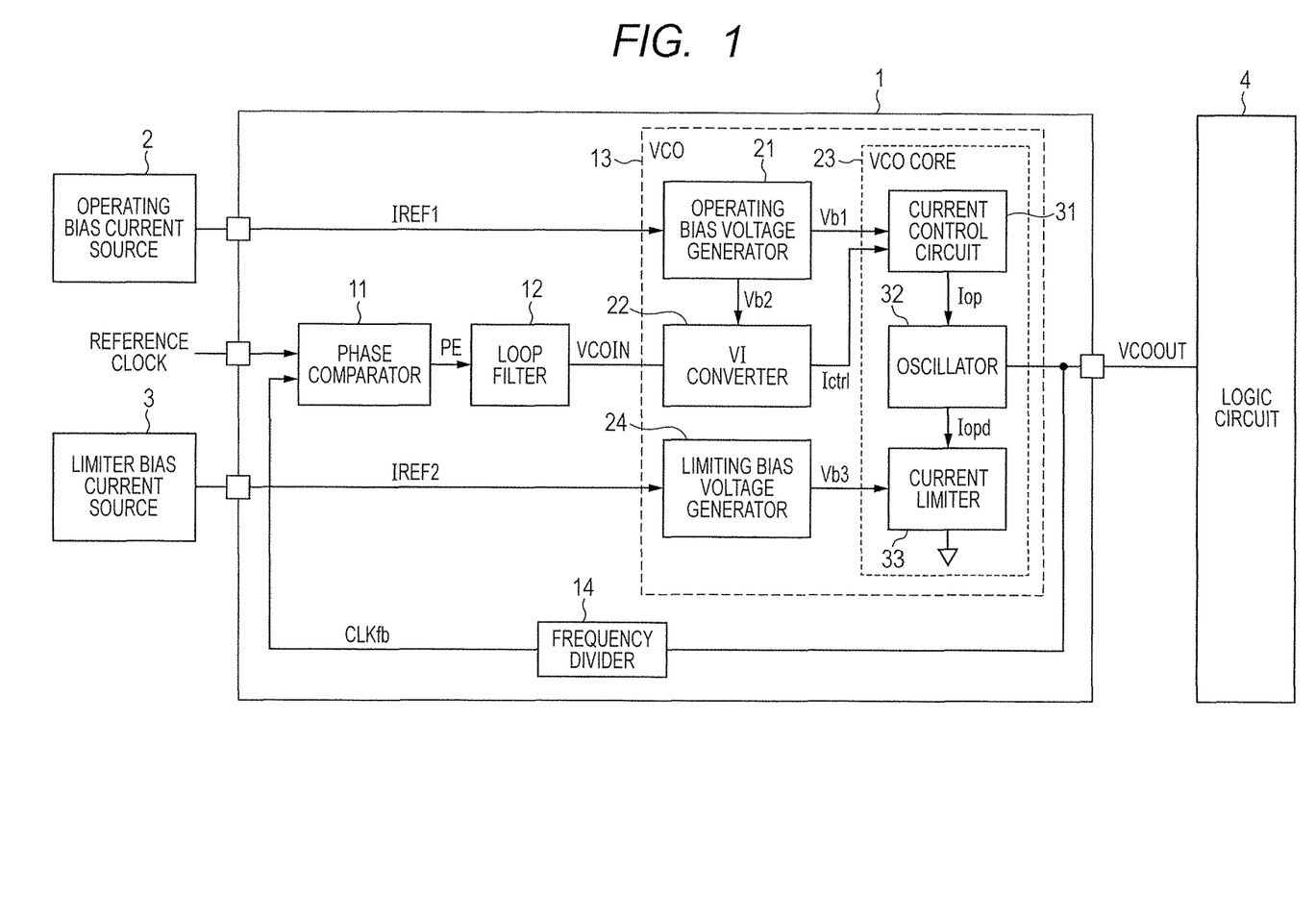
FIG. 1 is a block diagram of a semiconductor device according to the first embodiment.

First of all, a block diagram of a semiconductor device according to the first embodiment is shown in FIG. 1. As shown in FIG. 1, the semiconductor device according to the first embodiment includes a PLL circuit 1, a first constant current source (e.g. operating bias current source 2), a second constant current source (limiter bias current source 3), and a logic circuit 4. These circuits are integrated on a single chip of the semiconductor device according to the first embodiment described herein; however, the circuits can be separately fabricated on different chips.

The PLL circuit 1 outputs an output clock signal VCOOUT having a frequency that is a multiple of the frequency of a reference clock. The reference clock is generated by, for example, a circuit using a crystal oscillator or other types of oscillators provided as an external component of the semiconductor device; however, a circuit internally provided in the semiconductor device can be also used to generate the reference clock. The detailed description of the PLL circuit 1 will be given later.

The operating bias current source 2 generates a first constant current IREF1. The PLL circuit 1 uses the first constant current IREF1 as an operating current, and determines the main frequency of the output clock signal VCOOUT based on the first constant current IREF1. The PLL circuit 1 also adjusts the frequency of the output clock signal VCOOUT in accordance with a control current Ictrl whose value is adjustable based on a frequency control voltage VCOIN generated in the PLL circuit 1.

The limiter bias current source 3 generates a second constant current IREF2. Based on the second constant current IREF2, the PLL circuit 1 sets the upper limit of a current to be used to control an oscillating frequency to a certain value.

The logic circuit 4 performs various types of processing based on the output clock signal VCOOUT generated by the PLL circuit 1. The logic circuit 4 has a preset maximum clock frequency at which the logic circuit 4 can operate properly, and therefore the PLL circuit 1 generates output clock signals VCOOUT having a frequency equal to or lower than the maximum clock frequency.

Now the PLL circuit 1 will be described in detail. As shown in FIG. 1, the PLL circuit 1 includes a phase comparator (phase difference detection circuit) 11, a loop filter 12, a voltage controlled oscillator 13, and a frequency divider 14. The frequency divider 14 generates a feedback signal CLKfb having a frequency obtained by dividing the frequency of an output clock signal VCOOUT. The phase comparator 11 compares the feedback signal CLKfb with the reference clock to generate a phase difference detection signal (e.g. phase error signal PE) that represents the difference in phase between the two clock signals. The loop filter 12 smooths the phase error signal PE to generate a frequency control voltage VCOIN having a voltage level in accordance with the phase difference. The voltage controlled oscillator 13 generates an output clock signal VCOOUT having a frequency in accordance with the voltage level of the frequency control voltage VCOIN.

The voltage controlled oscillator 13 includes a first bias voltage generation circuit (e.g. operating bias voltage generator 21), a voltage-current converter 22, a VCO core 23, and a second bias voltage generation circuit (e.g. limiting bias voltage generator 24).

The operating bias voltage generator 21 generates a current bias voltage Vb1 in accordance with the first constant current IREF1. In addition, the operating bias voltage generator 21 generates an operating bias voltage Vb2 in accordance with the first constant current IREF1. The voltage-current converter 22 generates a control current Ictrl having a current value in accordance with the voltage level of the frequency control voltage VCOIN. The limiting bias voltage generator 24 generates a limiting voltage Vb3 in accordance with the second constant current IREF2. The limiting voltage Vb3 determines a current value to which a current limiter 33 limits the current.

The VCO core 23 includes a current control circuit 31, an oscillator 32, and the current limiter (current limiting circuit) 33. The current control circuit 31 generates a first bias current in accordance with the current bias voltage Vb1, and feeds the sum of the bias current and control current Ictrl to the oscillator 32. The operating current Iop shown in FIG. 1 represents the sum of the bias current and control current Ictrl. The oscillator 32 varies the frequency of the output clock signal VCOOUT in accordance with the value of the control current. The frequency variation of the output clock signal VCOOUT results from the fact that the varying current component contained in the operating current Iop is the control current Ictrl. The current limiter 33 limits the current Iopd flowing through the oscillator 32 in accordance with the limiting voltage Vb3 transmitted through a signal-flow path (e.g. a path formed with the limiter bias current source 3 and limiting bias voltage generator 24) provided independently from the other circuits.

Figure 2:
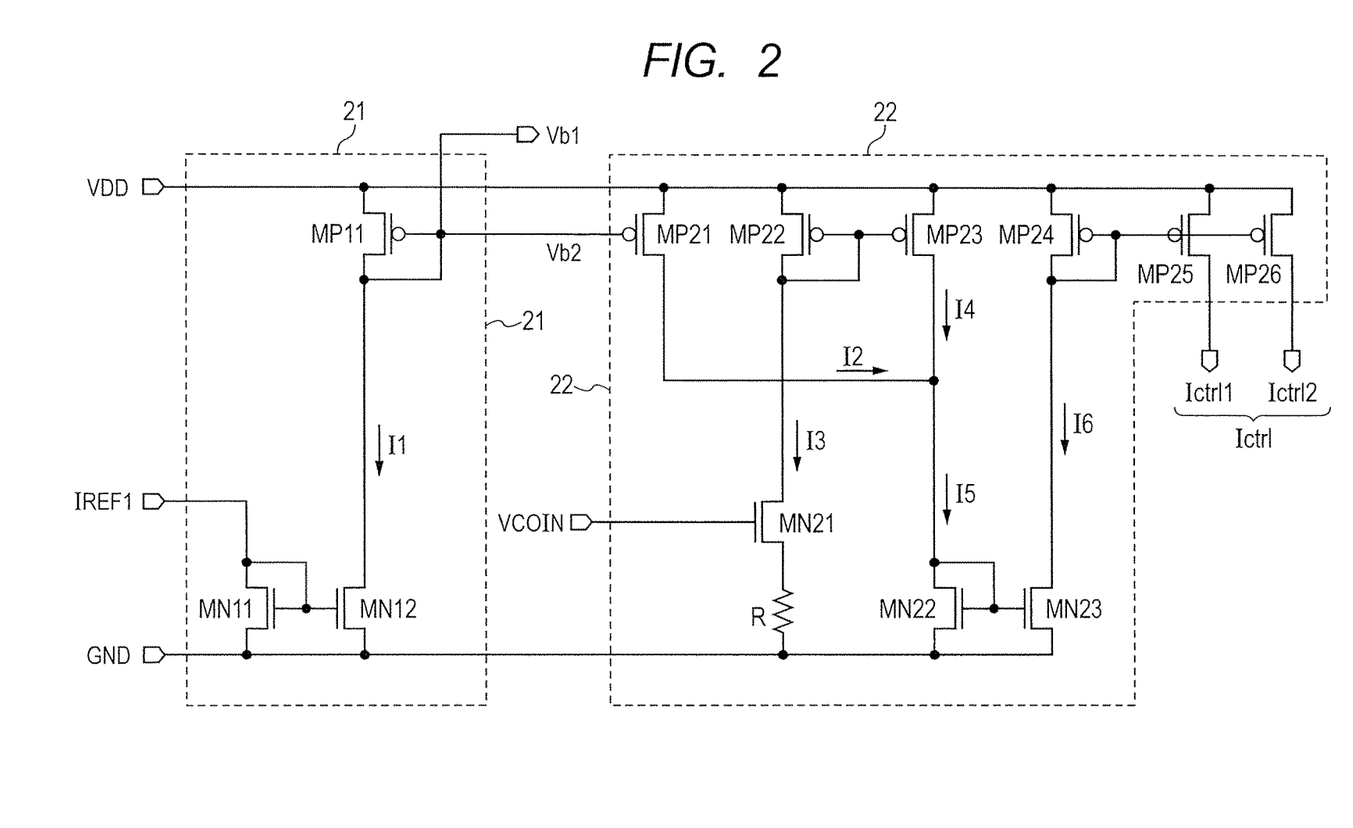
FIG. 2 is a circuit diagram of an operating bias voltage generator and a voltage-current converter according to the first embodiment.

Next, the circuits in the voltage controlled oscillator 13 will be described in further detail. FIG. 2 is a circuit diagram of the operating bias voltage generator 21 and voltage-current converter 22 according to the first embodiment.

As shown in FIG. 2, the operating bias voltage generator 21 includes NMOS transistors MN11 and MN12, and a PMOS transistor MP11. The NMOS transistors MN11 and MN12 make up a current mirror circuit. The first constant current IREF1 input to the NMOS transistor MN11 is mirrored by the NMOS transistors MN11 and MN12, and is output from the NMOS transistor MN12 as a current I1. The PMOS transistor MP11, which is a diode-connected transistor, outputs a gate voltage generated in accordance with the amplitude of the current I1 as a current bias voltage Vb1 and an operating bias voltage Vb2.

The voltage-current converter 22 includes NMOS transistors MN21 to MN23, PMOS transistors MP21 to MP23, and a resistor R. The PMOS transistor MP21 makes up a current mirror circuit with the PMOS transistor MP11 in the operating bias voltage generator 21. The current I1 input to the PMOS transistor MP11 is mirrored, and is output from the PMOS transistor MP21 as a current I2.

The source of the NMOS transistor MN21 is coupled to a grounding link via the resistor R. The gate of the NMOS transistor MN21 receives a frequency control voltage VCOIN. The NMOS transistor MN21 outputs a current I3 from its drain. The value of the current I3 varies in accordance with the magnitude of the frequency control voltage VCOIN.

The PMOS transistors MP22 and MP23 make up a current mirror circuit. The current I3 input to the PMOS transistor MP22 is mirrored by the PMOS transistors MP22 and MP23, and is output from the PMOS transistor MP23 as a current I4. The current I4 is added to the current I2 on a line that couples the drain of the PMOS transistor MP23 and the NMOS transistor MN22, and is fed to the NMOS transistor MN22 as a current I5.

The NMOS transistors MN22 and MN23 make up a current mirror circuit. The current I5 input to the NMOS transistor MN22 is mirrored by the NMOS transistors MN22 and MN23, and is output from the NMOS transistor MN23 as a current I6. The PMOS transistors MP24 to MP26 make up a current mirror circuit. The current I6 input to the PMOS transistor MP24 is mirrored by the PMOS transistors MP24 to MP26, and is output as a control current Ictrl1 from the PMOS transistor MP25, and is also output as a control current Ictrl2 from the PMOS transistor MP26. The control current Ictrl1 and control current Ictrl2 are fed as a control current Ictrl to the current control circuit 31.

Figure 3:
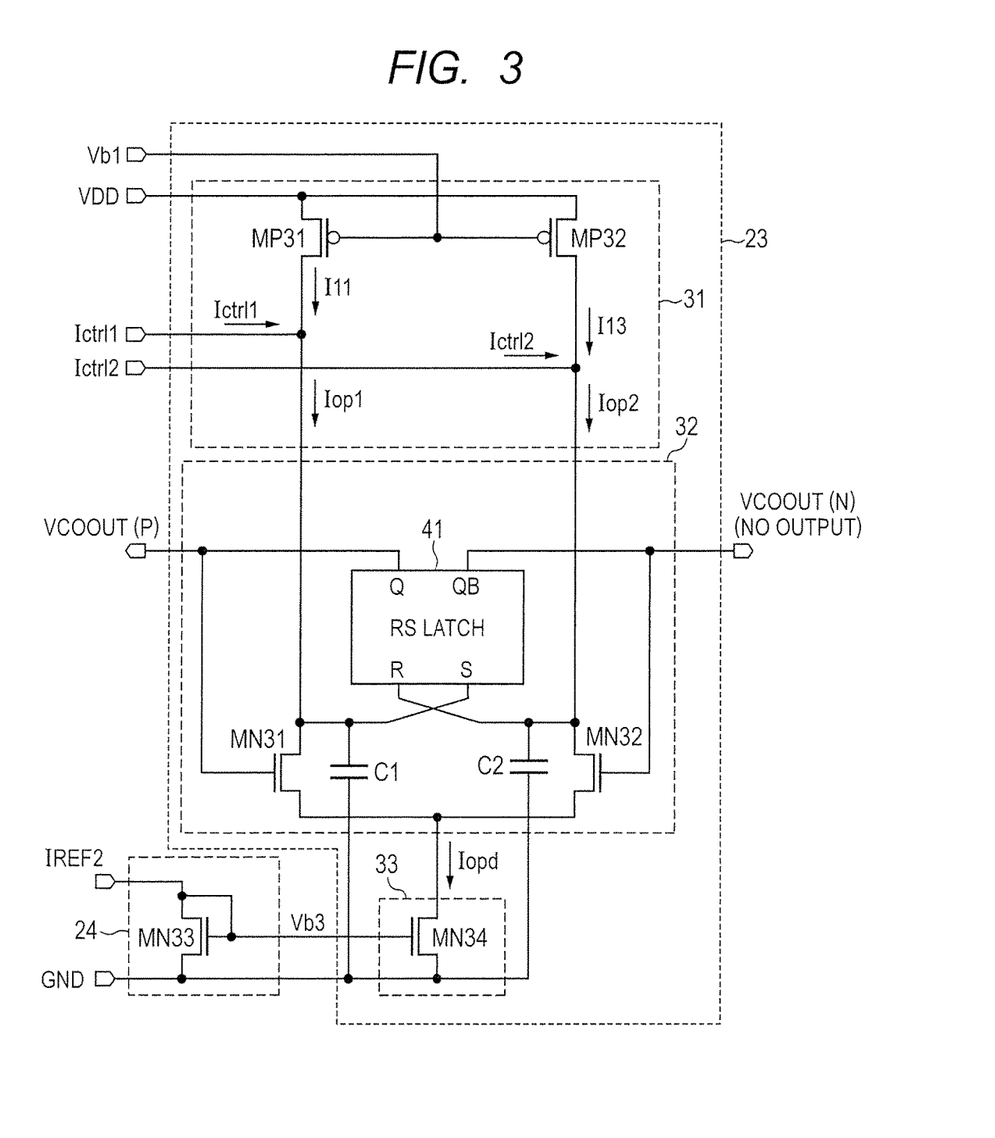
FIG. 3 is a circuit diagram of a VCO core and a limiting bias voltage generator according to the first embodiment.

A circuit diagram of the VCO core 23 and limiting bias voltage generator 24 according to the first embodiment is shown in FIG. 3. As shown in FIG. 3, the current control circuit 31 includes PMOS transistors MP31 and MP32. The gate voltage from the PMOS transistor MP11 in the operating bias voltage generator 21 is fed as a current bias voltage Vb1 to the gates of the PMOS transistors MP31 and MP32. Thus, the PMOS transistors MP31 and MP32 make up a current mirror circuit together with the PMOS transistor MP11. The PMOS transistor MP31 outputs the mirrored current I1 as a current I11. The current control circuit 31 outputs a current Iop1, which is the sum of the control current Ictrl1 and current I11, to the oscillator 32. The PMOS transistor MP32 outputs the mirrored current I1 as a current I13. The current control circuit 31 outputs an operating current Iop2, which is the sum of the control current Ictrl2 and current I13, to the oscillator 32.

The oscillator 32 includes NMOS transistors MN31 and MN32, an R-S latch 41, and capacitors C1 and C2. The NMOS transistors MN31 and MN32 make up a differential pair. The operating current Iop1 is input to the drain of the NMOS transistor MN31. The operating current Iop2 is input to the drain of the NMOS transistor MN32. The R-S latch 41 has a reset terminal R coupled to the drain of the NMOS transistor MN32. The R-S latch 41 has a set terminal S coupled to the drain of the NMOS transistor MN31. The R-S latch 41 has an output terminal Q coupled to the gate of the NMOS transistor MN31 and serving as an output terminal of the current control circuit 31. The R-S latch 41 has an inverting output terminal QB coupled to the gate of the NMOS transistor MN32. The capacitor C1 is coupled to between the set terminal S of the R-S latch 41 and a grounding link. The capacitor C2 is coupled to between the reset terminal R of the R-S latch 41 and the grounding link.

The limiting bias voltage generator 24 includes a first transistor (e.g. an NMOS transistor MN33). The current limiter 33 includes a second transistor (e.g. an NMOS transistor MN34). The NMOS transistors MN33 and MN34 make up a current mirror circuit. In addition, the NMOS transistor MN34 is coupled to between a common coupling point of the NMOS transistors MN31 and MN32 and the grounding link. Specifically, the limiting bias voltage generator 24 has the NMOS transistor MN33 through which the incoming current is input to the current mirror circuit, while the current limiter 33 has the NMOS transistor MN34 through which the mirrored current is output from the current mirror circuit. The NMOS transistor MN34 has the source coupled to the grounding link, the drain coupled to the oscillator 32, and the gate to which a common gate voltage in the current mirror circuit is input as a limiting voltage Vb3. The second constant current IREF2 input to the NMOS transistor MN33 is mirrored by the NMOS transistors MN33 and MN34, and the value of the mirrored current is determined as the maximum value of a current the NMOS transistor MN34 can feed.

In other words, the semiconductor device according to the first embodiment draws out the charge stored in the capacitor C1 by using the NMOS transistor MN31, while charging the capacitor C2 with the operating current Iop2 at the time when the output clock signal VCOOUT is switched from the low level to the high level. When the capacitor C2 is determined that its voltage has reached to the high level, the R-S latch 41 switches the output clock signal VCOOUT from the high level to the low level.

Then, the semiconductor device draws out the charge stored in the capacitor C2 by using the NMOS transistor MN32, while charging the capacitor C1 with the operating current Iop1 at the time when the output clock signal VCOOUT is switched from the high level to the low level. When the capacitor C1 is determined that its voltage has reached to the high level, the R-S latch 41 switches the output clock signal VCOOUT from the low level to the high level.

While the oscillator 32 performs the above-described operations, the current flowing across the NMOS transistor MN34 has a magnitude equivalent to that of the operating current Iop1 and operating current Iop2. However, the maximum value of the current flowing across the NMOS transistor MN34 is limited in accordance with the magnitude of the second constant current IREF2. In short, in the semiconductor device according to the first embodiment, the maximum value of the current to be used for operating the oscillator 32 is limited by the NMOS transistor MN34.

Figure 4:
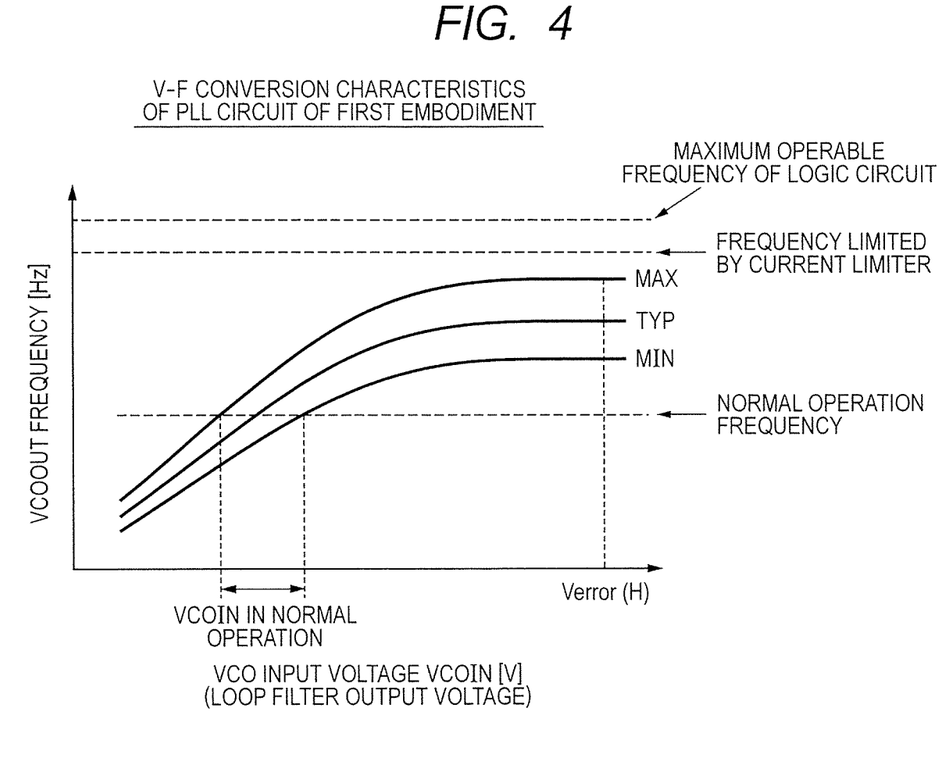
FIG. 4 is a graph showing the voltage-frequency conversion characteristics of a voltage controlled oscillator in the semiconductor device according to the first embodiment.

Next, the operation of the semiconductor device according to the first embodiment will be described. FIG. 4 is a graph showing the voltage-frequency conversion characteristics of the voltage controlled oscillator 13 in the semiconductor device according to the first embodiment. The graph in FIG. 4 indicates frequency characteristics when there are no variations in components (e.g. TYP), maximum values of frequency characteristics when the frequency of the output clock signal VCOOUT fluctuates to the higher side due to variations in components making up the voltage control oscillator 13 (e.g. MAX), and minimum values of the frequency characteristics when the frequency of the output clock signal VCOOUT fluctuates to the lower side due to variations in the components (e.g. MIN).

As shown in FIG. 4, in the semiconductor device according to the first embodiment, the frequency of the output clock signal VCOOUT varies in accordance with the magnitude of the frequency control voltage VCOIN. The voltage controlled oscillator 13 in the semiconductor device according to the first embodiment is designed to output the output clock signal VCOOUT having a frequency equal to or lower than a frequency limit imposed by the current limiter 33 even if the frequency control voltage VCOIN abnormally rises, for example, to the source voltage level (Verror (H) in FIG. 4). In addition, the frequency limit imposed by the current limiter 33 is preset so as to be equal to or lower than the maximum frequency at which the logic circuit 4 can operate. The semiconductor device thus designed according to the first embodiment can prevent the logic circuit 4 from operational malfunctions even if some troubles occur, for example, the frequency control voltage VCOIN remains at the high level (e.g. source voltage level).

However, the above-described measures cannot prevent the output clock signal VCOOUT from exceeding the maximum operable frequency of the logic circuit 4 when an abnormal rise of the operating current Iop occurs due to the fact that the current bias voltage Vb1 or operating bias voltage Vb2 output from the operating bias voltage generator 21 remains at the low level, or other reasons. To prevent the output clock signal VCOOUT from exceeding the maximum operable frequency, the semiconductor device according to the second embodiment allows the current limiter 33 to limit the frequency of the output clock signal VCOOUT.

Specifically, for example, if the current bias voltage Vb1 remains at the low level in the semiconductor device according to the first embodiment, an extreme rise of the operating current Iop occurs. However, the semiconductor device according to the first embodiment has the current limiter 33 that limits the current to be used in the oscillator 32 in accordance with the second constant current IREF2. Thus, in the semiconductor device according to the first embodiment, the maximum value of the increased operating current Iop is limited by the current limiter 33, and the frequency of the output clock signal VCOOUT is also limited accordingly.

As described above, the semiconductor device according to the first embodiment sets the maximum value of oscillating frequency of the voltage controlled oscillator 13, which varies in accordance with the voltage value of the frequency control voltage VCOIN, to be equal to or lower than the maximum value at which the logic circuit 4 can operate (or equal to or lower than the frequency limit imposed by the current limiter 33). Thus, the semiconductor device according to the first embodiment can prevent the frequency of the output clock signal VCOOUT from exceeding the maximum operable frequency of the logic circuit 4 even if the frequency control voltage VCOIN remains at the source voltage level.

In addition, the semiconductor device according to the first embodiment includes the current limiter 33 that limits the current flowing in the oscillator 32 when a malfunction, such as an extreme rise of the operating current Iop, occurs, and thereby prevents the oscillating frequency of the oscillator 32 from exceeding the maximum operable frequency of the logic circuit 4.

Furthermore, the current limiter 33 of the semiconductor device according to the first embodiment limits the current value in accordance with a limiting voltage transmitted through the signal-flow path that is not affected by other circuits making up the PLL circuit 1 and is independently provided from the circuits. Thus, the semiconductor device according to the first embodiment can limit the oscillating frequency of the oscillator 32 without being affected by a malfunction occurring over paths different from the path used to control the operation of the current limiter 33.

Second Embodiment

The second embodiment described herein presents a different semiconductor device from that in the first embodiment. In the second embodiment, like components described in the first embodiment will be denoted by like numerals, and will not be further explained.

Figure 5:
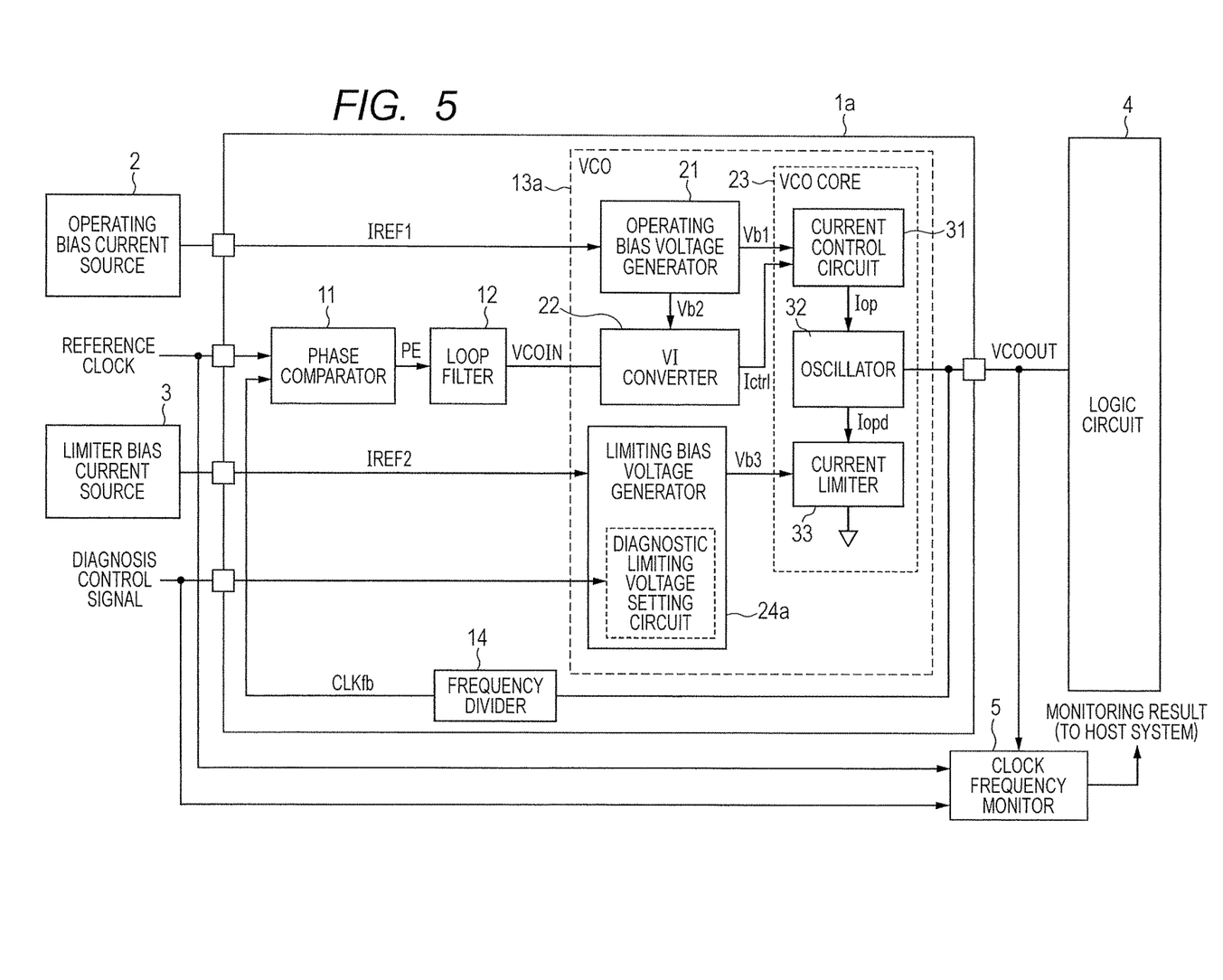
FIG. 5 is a block diagram of a semiconductor device according to the second embodiment.

FIG. 5 is a block diagram of a semiconductor device according to the second embodiment. As shown in FIG. 5, the semiconductor device according to the second embodiment is identical to the semiconductor device according to the first embodiment, but includes a clock frequency monitor 5. In addition, the semiconductor device according to the second embodiment includes a PLL circuit 1a instead of the PLL circuit 1. The PLL circuit 1a includes a voltage controlled oscillator 13a having a limiting bias voltage generator 24a, which is a replacement of the limiting bias voltage generator 24 of the voltage controlled oscillator 13.

The limiting bias voltage generator 24a is identical to the limiting bias voltage generator 24, but includes a diagnostic limit setting circuit. The diagnostic limit setting circuit varies the magnitude of a limiting voltage Vb3 in accordance with diagnosis control signals fed from a diagnosis control unit (not shown). More specifically, the diagnostic limit setting circuit switches the frequency of the output clock signal VCOOUT between a first diagnostic frequency and a second diagnostic frequency by changing the limiting voltage Vb3. The first diagnostic frequency is lower than a preset normal operating frequency and higher than an underclock frequency set as the lower limit of the frequency of the output clock signal VCOOUT, while the second diagnostic frequency is equal to or lower than the underclock frequency.

When the frequency of the output clock signal VCOOUT is switched in response to a diagnosis control signal, the clock frequency monitor 5 detects if the frequency is normal or abnormal. If the clock frequency monitor 5 detects no frequency abnormality when the frequency is set to the first diagnostic frequency and also detects an underclock frequency when the frequency is set to the second diagnostic frequency, the clock frequency monitor 5 determines that the current limiter 33 functions normally. On the contrary, if the clock frequency monitor 5 detects a frequency abnormality (underclock or overclock) when the frequency is set to the first diagnostic frequency or detects no underclock frequency when the frequency is set to the second diagnostic frequency, the clock frequency monitor 5 determines that the current limiter 33 has a fault. The clock frequency monitor 5 distinguishes whether the presently performed diagnostic sequence is a diagnosis carried out with the first diagnostic frequency or with the second diagnostic frequency based on the diagnosis control signal.

Figure 6:
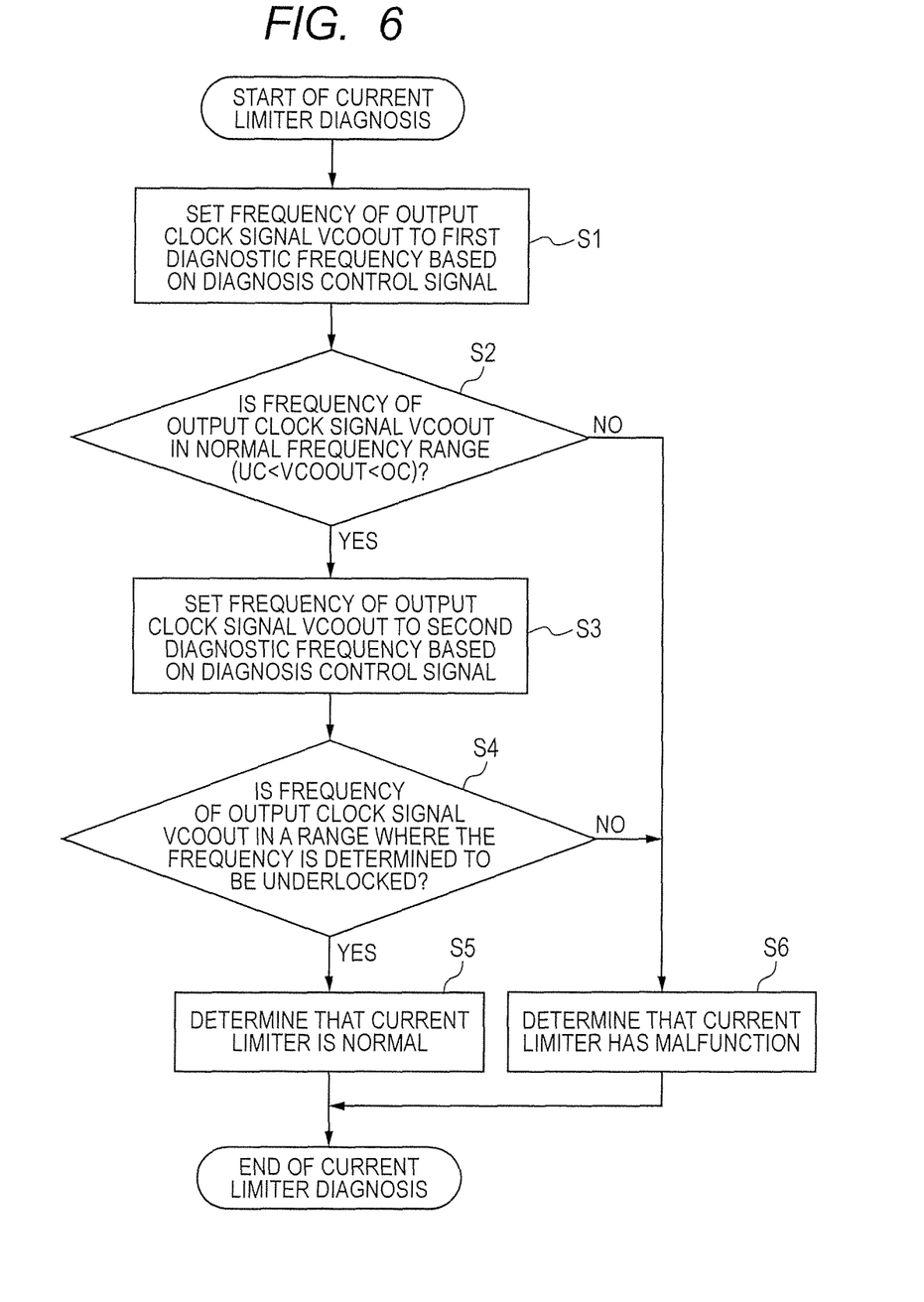
FIG. 6 is a flowchart to explain a diagnosis process by the semiconductor device according to the second embodiment.

Next, a diagnosis process by the semiconductor device according to the second embodiment will be described. FIG. 6 is a flowchart for explaining the steps of the diagnosis process by the semiconductor device according to the second embodiment. As shown in FIG. 6, the diagnosis process by the semiconductor device according to the second embodiment begins with setting the frequency of the output clock signal VCOOUT to the first diagnostic frequency in response to a diagnosis control signal (step S1). More specifically, the limiting bias voltage generator 24a in the semiconductor device according to the second embodiment generates a limiting voltage Vb3 lower than that in normal operation based on the diagnosis control signal to thereby set the oscillating frequency of the oscillator 32 to the first diagnostic frequency.

Then, the semiconductor device according to the second embodiment uses the clock frequency monitor 5 to determine if the frequency of the output clock signal VCOOUT is within a normal frequency range (step S2). The normal frequency range covers a range between an underclock frequency UC and an overclock frequency OC (UC<VCOOUT<OC). In step S2, if the frequency of the output clock signal VCOOUT is determined to be an abnormal frequency (underclock or overclock), the clock frequency monitor 5 determines that the current limiter 33 has a malfunction (step S6), and notifies a host system of the malfunction in the current limiter 33. On the other hand, if the frequency of the output clock signal VCOOUT is determined to be in the normal frequency range in step S2, the clock frequency monitor 5 determines that the current limiter 33 has no malfunction at this point in time. Then, the process goes to step S3.

In step S3, the semiconductor device according to the second embodiment sets the frequency of the output clock signal VCOOUT to the second diagnostic frequency based on a diagnosis control signal. More specifically, the limiting bias voltage generator 24a in the semiconductor device according to the second embodiment generates a limiting voltage Vb3 lower than that in step S1 based on the diagnosis control signal to thereby set the oscillating frequency of the oscillator 32 to the second diagnostic frequency.

Then, the semiconductor device according to the second embodiment uses the clock frequency monitor 5 to determine if the frequency of the output clock signal VCOOUT is in a range where the frequency is determined to be in an underlocked state (step S4). If the frequency of the output clock signal VCOOUT is determined not to be an underclock frequency in step S4, the clock frequency monitor 5 determines that the current limiter 33 has a malfunction (step S6), and notifies the host system of the malfunction of the current limiter 33. On the other hand, if the frequency of the output clock signal VCOOUT is determined to be an underclock frequency in step S4, the clock frequency monitor 5 determines that the current limiter 33 functions normally (step S5). Upon completion of step S5 or step S6, the semiconductor device according to the second embodiment terminates the diagnosis process.

Although the clock frequency monitor 5 described above with reference to FIGS. 5 and 6 is configured to determine if the current limiter 33 is normal or abnormal and notify the host system, the clock frequency monitor 5 in another configuration can determine only if the clock frequency is normal or abnormal (overclock or underclock) and notifies the host system of the determination result to allow the host system to determine if the current limiter 33 is normal or abnormal. Specifically, the clock frequency monitor 5 can be configured to notify the host system of the determination result that the frequency of the output clock signal VCOOUT is an abnormal frequency (underclock or overclock) in step S2, and the host system determines that the current limiter 33 has a malfunction (step S6). On the other hand, the clock frequency monitor 5 notifies the host system of the determination result that the frequency of the output clock signal VCOOUT is in the normal frequency range in step S2, and the host system determines that no malfunction is found in the current limiter 33.

Furthermore, the clock frequency monitor 5 can be configured to notify the host system of the determination result that the frequency of the output clock signal VCOOUT is not an underclock in step S4, and the host system determines that the current limiter 33 has a malfunction (step S6). On the other hand, the clock frequency monitor 5 notifies the host system of the determination result that the frequency of the output clock signal VCOOUT is an underclock in step S4, and the host system determines that the current limiter 33 functions normally (step S5).

Figure 7:
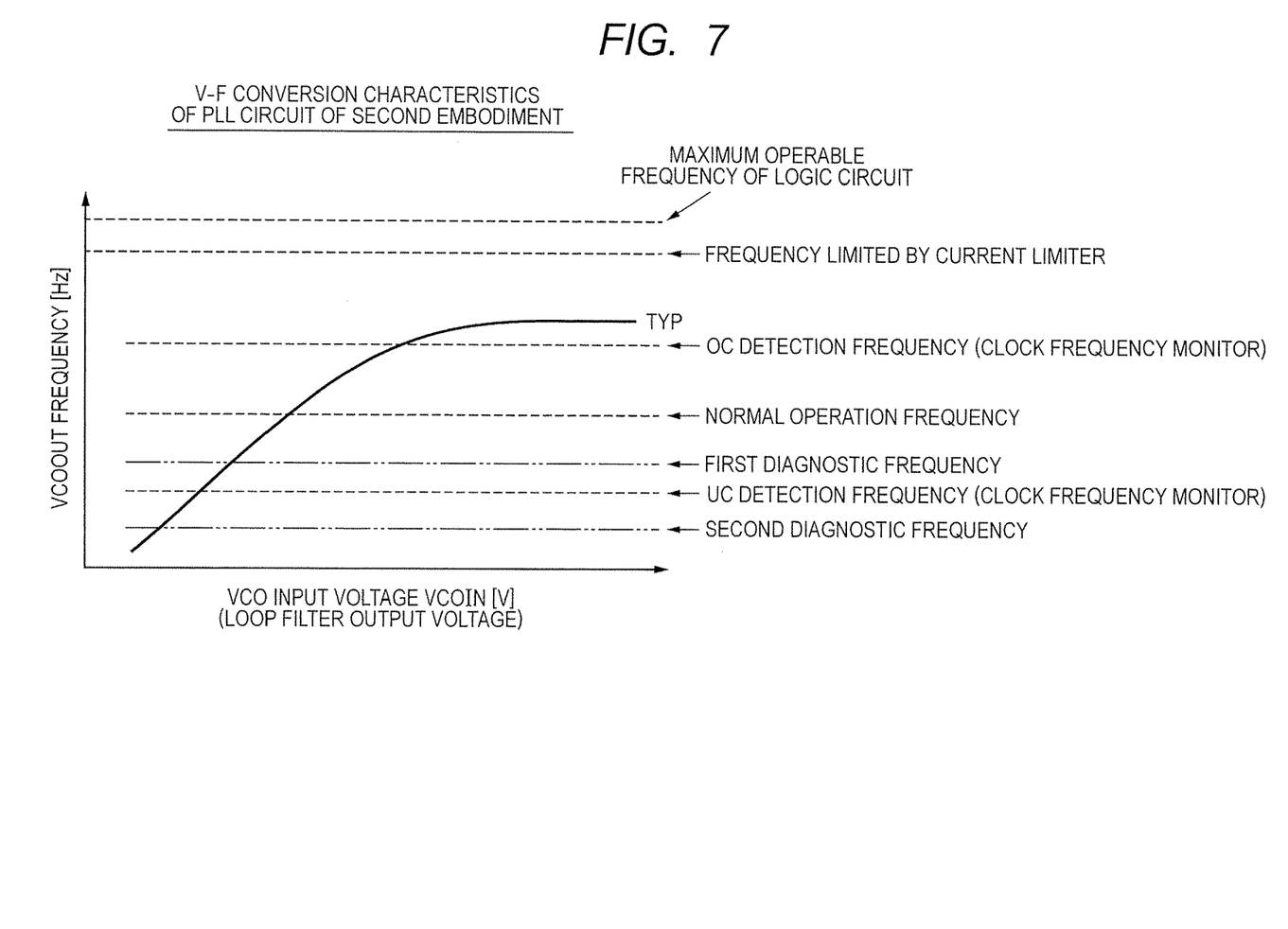
FIG. 7 illustrates a first diagnostic frequency and a second diagnostic frequency used in the semiconductor device according to the second embodiment.

The description now proceeds to the first diagnostic frequency and second diagnostic frequency used in the diagnosis process by the semiconductor device according to the second embodiment. FIG. 7 illustrates the first diagnostic frequency and second diagnostic frequency used in the semiconductor device according to the second embodiment.

As shown in FIG. 7, the clock frequency monitor 5 according to the second embodiment defines the range between an overclock detection frequency (e.g. OC detection frequency) and an underclock detection frequency (e.g. UC detection frequency) as a normal frequency range of the output clock signal VCOOUT. The set values of the underclock detection frequency and overclock detection frequency are stored in the clock frequency monitor 5.

In the second embodiment, the first diagnostic frequency is set to be lower than the normal operating frequency, which is set as the frequency of the output clock signal VCOOUT in normal operation, and higher than the underclock detection frequency. The second diagnostic frequency in the second embodiment is set to be lower than the underclock detection frequency.

It is apparent from the foregoing description that the semiconductor device according to the second embodiment can detect a fault in the current limiter 33 through the diagnosis process. In the diagnosis process of the second embodiment, the semiconductor device uses the current limiter 33 to vary the frequency of the output clock signal VCOOUT into two different frequencies, and thereby diagnoses that the frequency value to be limited by the current limiter 33 is maintained to be normal without fluctuating between high and low. In addition, setting the first diagnostic frequency value and second diagnostic frequency value close to the underclock detection frequency value can increase the sensitivity to detect an abnormality caused by abnormal fluctuation in the frequency value to be limited by the current limiter 33, thereby improving diagnostic accuracy. The extent of how close the values of the first and second diagnostic frequencies can be set to the underclock detection frequency value depends on variations in components and is limited such that the first diagnostic frequency value does not fall below the underclock detection frequency value and the second diagnostic frequency value does not exceed the underclock detection frequency value.

In addition, the semiconductor device according to the second embodiment varies the frequency of the output clock signal VCOOUT into two frequencies on an upper side and a lower side with respect to the underclock frequency UC detectable by the clock frequency monitor 5. Thus, the semiconductor device according to the second embodiment can diagnose the current limiter 33 as abnormal by utilizing the function of the clock frequency monitor 5 for detecting abnormal clock frequencies without adding a new circuit designed for diagnosing an abnormality in the current limiter 33. Furthermore, the semiconductor device according to the second embodiment can detect an abnormality in the current limiter 33 while outputting clock signals having a frequency in the operable range of the logic circuit 4, by raising and lowering the diagnostic frequency with respect to the underclock frequency UC.

Instead of the diagnosis process by the semiconductor device according to the second embodiment, another method can also make a similar diagnosis. For example, the clock frequency monitor in the method is provided with an additional function of detecting that the output clock signal has an intended frequency value when the frequency is set to the second diagnostic frequency, which is equal to or lower than the underclock frequency as described in the second embodiment. If the output clock signal does not have the intended frequency value, it can be determined that the current limiter 33 has a fault. Diagnosing with the frequency equal to or lower than the underclock frequency can avoid misconstruing a frequency abnormality caused by a small operating current Iop as an abnormality in the current limiter 33.

Third Embodiment

The third embodiment described herein presents a different semiconductor device from that in the first embodiment. In the third embodiment, like components described in the first embodiment will be denoted by like numerals, and will not be further explained.

Figure 8:
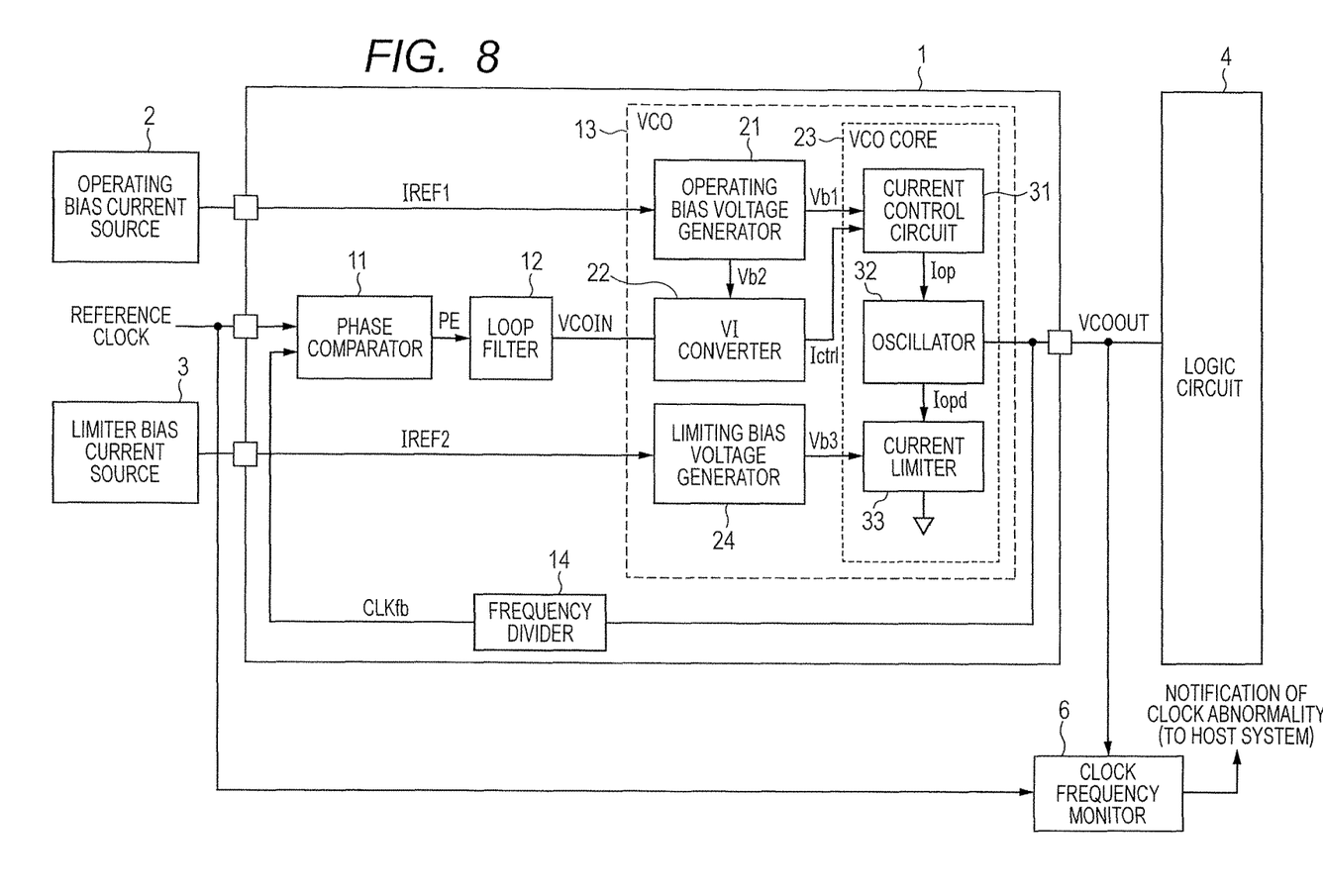
FIG. 8 is a block diagram of a semiconductor device according to the third embodiment.

FIG. 8 is a block diagram of a semiconductor device according to the third embodiment. As shown in FIG. 8, the semiconductor device according to the third embodiment is identical to the semiconductor device according to the first embodiment, but includes a clock frequency monitor 6. The clock frequency monitor 6 outputs a clock abnormality notification signal to notify of the abnormal frequency when the frequency of the output clock signal exceeds a preset frequency range. When the clock frequency monitor 6 detects that the frequency of the output clock signal VCOOUT is out of the range between the overclock detection frequency and underclock detection frequency described in FIG. 7, the clock frequency monitor 6 outputs the clock abnormality notification signal to notify of the abnormal frequency. Then, the notification signal output by the clock frequency monitor 6 is transmitted to the host system.

As in the case of the PLL circuit 1 according to the first embodiment, the PLL circuit 1 according to the third embodiment can limit the frequency of the output clock signal VCOOUT to the maximum operable frequency of the logic circuit 4 or lower. Thus, the semiconductor device according to the third embodiment can allow the logic circuit 4 to keep operating even if the frequency of the output clock signal VCOOUT rises due to a fault. However, such operation should not be continued because it is not a normal operation.

The semiconductor device according to the third embodiment is configured to notify the host system that the frequency of the output clock signal VCOOUT is in an abnormal state. This configuration can, for example, issue an error alert to a user or an operator to take a measure, such as safe deactivation of the system. Continuous use of the system in an abnormal state may induce additional malfunctions. However, rather than abruptly or abnormally terminating the system in the abnormal state, deactivating the system in accordance with the prescribed procedure can enhance the safety of the system.

While the invention made by the present inventors has been described concretely with reference to the foregoing embodiments, it goes without saying that the present invention is not limited to the embodiments and that various modifications can be made without departing from the gist of the invention.

What is claimed is:

1. A semiconductor device comprising:
   a phase difference detection circuit outputting a phase difference detection signal representing a difference in phase between a feedback signal generated based on an output clock signal and a reference clock signal;
   a loop filter smoothing the phase difference detection signal to generate a frequency control voltage having a voltage level in accordance with the phase difference; and
   a voltage controlled oscillator generating an output clock signal having a frequency in accordance with the voltage level of the frequency control voltage,
   wherein the voltage controlled oscillator includes
      a voltage-current converter generating a control current having a current value in accordance with the voltage level of the frequency control voltage,
      an oscillator varying the frequency of the output clock signal in accordance with the current value of the control current,
      a current limiting circuit limiting a current flowing in the oscillator in accordance with a limiting voltage transmitted through a signal-flow path provided independently from the phase difference detection circuit, the loop filter, and the voltage controlled oscillator,
      a first bias voltage generation circuit generating a current bias voltage in accordance with a first constant current generated by a first constant current source, and
      a current control circuit generating a first bias current in accordance with the current bias voltage, and feeding a sum of the bias current and the control current to the oscillator.

2. The semiconductor device according to claim 1, further comprising
   a second bias voltage generation circuit generating the limiting voltage in accordance with a second constant current generated by a second constant current source.

3. The semiconductor device according to claim 2,
   wherein the second bias voltage generation circuit includes a first transistor through which an incoming current is input in a current mirror circuit,
   wherein the current limiting circuit includes a second transistor through which a mirrored current is output in the current mirror circuit, and
   wherein the second transistor has a source coupled to a grounding link, a drain coupled to the oscillator, and a gate to which a common gate voltage in the current mirror circuit is input as a limiting voltage.

4. The semiconductor device according to claim 2, further comprising
   a clock frequency monitor monitoring the frequency of the output clock signal,
   wherein the second bias voltage generation circuit includes a diagnostic limit setting circuit that changes a current value to be limited by the current limiting circuit to small values in accordance with a diagnosis control signal to switch the frequency of the output clock signal between a first diagnostic frequency and a second diagnostic frequency, the first diagnostic frequency being lower than a preset normal operating frequency and higher than an underclock frequency set as a lower limit of the frequency of the output clock signal, and the second diagnostic frequency being equal to or lower than the underclock frequency, and
   wherein if the clock frequency monitor detects a frequency abnormality when the frequency of the output clock signal is switched to the first diagnostic frequency in response to the diagnosis control signal or if the clock frequency monitor detects no underclock frequency when the frequency of the output clock signal is switched to the second diagnostic frequency in response to the diagnosis control signal, the clock frequency monitor outputs a diagnosis signal to notify that the current limiting circuit has a fault.

5. The semiconductor device according to claim 1, further comprising
   a clock frequency monitor monitoring the frequency of the output clock signal,
   wherein the clock frequency monitor outputs a clock abnormality notification signal to notify of a frequency abnormality when the frequency of the output clock signal exceeds a preset frequency range.

6. The semiconductor device according to claim 2, further comprising
   a clock frequency monitor monitoring the frequency of the output clock signal,
   wherein the second bias voltage generation circuit includes a diagnostic limit setting circuit that changes a current value to be limited by the current limiting circuit to small values in accordance with a diagnosis control signal to switch the frequency of the output clock signal between a first diagnostic frequency and a second diagnostic frequency, the first diagnostic frequency being lower than a preset normal operating frequency and higher than an underclock frequency set as a lower limit of the frequency of the output clock signal, and the second diagnostic frequency being equal to or lower than the underclock frequency, and
   wherein if the clock frequency monitor detects a frequency abnormality when the frequency of the output clock signal is switched to the first diagnostic frequency or the second diagnostic frequency in response to the diagnosis control signal, the clock frequency monitor outputs a diagnosis signal to notify of the abnormality.

7. A control system including the semiconductor device according to claim 6,
   wherein the control system receives the diagnosis signal, and determines that the current limiting circuit has a fault if the clock frequency monitor detects a frequency abnormality when the frequency of the output clock signal is switched to the first diagnostic frequency or if the clock frequency monitor detects no frequency abnormality when the frequency of the output clock signal is switched to the second diagnostic frequency.

* * * * *